US006774665B2

United States Patent
Amick et al.

(10) Patent No.: US 6,774,665 B2
(45) Date of Patent: Aug. 10, 2004

(54) CASCODE SSTL OUTPUT BUFFER USING SOURCE FOLLOWERS

(75) Inventors: Brian W. Amick, Austin, TX (US); Lynn A. Warriner, Round Rock, TX (US); Claude R. Gauthier, Cupertino, CA (US); Tri K. Tran, San Leanardo, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/255,341

(22) Filed: Sep. 26, 2002

(65) Prior Publication Data

US 2004/0061526 A1 Apr. 1, 2004

(51) Int. Cl.[7] .............................................. H03K 17/16
(52) U.S. Cl. .......................... 326/30; 326/86; 326/31; 327/108; 327/530; 327/534
(58) Field of Search ........................ 326/30, 81, 83, 326/86; 327/530, 534, 108, 535, 538, 539

(56) References Cited

U.S. PATENT DOCUMENTS 6,388,495 B1 * 5/2002 Roy et al. ................... 327/309
6,495,997 B2 * 12/2002 Hall et al. ................... 323/316

OTHER PUBLICATIONS

"Stub Series Terminated Logic for 2.5 V (SSTL_2)", JESD8-9A (Revision of JESD8-9), Dec. 2000, JEDEC Standard, JEDEC Solid State Technology Association (22 pages).

* cited by examiner

Primary Examiner—Vibol Tan
(74) Attorney, Agent, or Firm—Osha & May L.L.P.

(57) ABSTRACT

A cascode SSTL output buffer using a source follower circuit includes a biasing circuit arranged to generate a first bias signal. The source follower circuit is responsive to the first bias signal and generates a second bias signal which is then used by a cascode circuit that receives an input signal to the SSTL output buffer to drive an output signal from the SSTL output buffer.

28 Claims, 5 Drawing Sheets

CASCODE SSTL OUTPUT BUFFER USING SOURCE FOLLOWERS

BACKGROUND OF THE INVENTION

As shown in FIG. 1, a typical computer system 10 includes at least a microprocessor 12 (often referred to and known as "CPU") and some form of memory 14. The microprocessor 12 has, among other components, arithmetic, logic, and control circuitry that interpret and execute instructions necessary for the operation and use of the computer system 10. Specifically, FIG. 1 shows the computer system 10 having the microprocessor 12, memory 14, crystal 18, integrated circuits (ICs) 16 that have various functionalities, and communication paths 19, i.e., buses and wires, that are necessary for the transfer of data among the aforementioned components of the computer system 10.

In order to keep pace with improving technologies, computer system and circuit designers are constantly trying to improve their designs through the most cost-effective means. As faster versions of a particular CPU become available, a designer will often try to improve the throughput of their existing design by simply increasing the CPU clock frequency. However, after a certain point, the speed of the system's main memory becomes a limiting factor in optimizing the throughput of the system. To this end, designers have produced faster memories, which, in turn, has necessitated high-speed memory interfaces.

One type of design that has been used for high-speed memory interface applications involves the use of stub series termination logic (SSTL). A SSTL interface standard was created by the Joint Electron Device Engineering Council (JEDEC) to provide a termination scheme for high speed signaling in applications such as double data rate synchronous dynamic random access memory (DDR-SDRAM). The SSTL interface standard specifies particular switching characteristics such that high operating frequencies are available. As operating frequencies continue to increase and as the demand for faster memory interfaces has and continues to grow, the SSTL interface standard continues to enjoy wide acceptance.

The SSTL interface standard defines operation around a reference voltage potential. A high or low bit may be transmitted as a voltage potential that is higher or lower than a reference voltage potential, respectively. There is a likelihood that the supply voltage for the SSTL interface will exceed the voltage tolerances of low-voltage transistors that are designed to operate at voltages below that of the SSTL interface. If a large voltage is placed across one of these low-voltage transistors, the gate oxide layer of the transistor may breakdown, which, in turn, could cause circuit malfunction FIG. 2 shows a typical SSTL output buffer pull down circuit 200 that includes resistors $R_1$ 202 and $R_2$ 204 to provide a bias signal on node $N_1$ 211. A cascode circuit includes transistors 218 and 216. The cascode circuit is used to prevent the possible breakdown of transistors 218 and 216 when an output signal 215 is at a maximum voltage potential.

The output signal 215 is pulled down depending on an input_low signal. The input_low signal may have a voltage potential range less than a maximum voltage potential of the output signal 215, where the voltage potential range is defined as the difference between a maximum and minimum voltage potential applied on the input_low signal.

In FIG. 2, the transistor 218 is connected to the bias signal on node $N_1$ 211. To reduce power consumption, resistors $R_1$ 202 and $R_2$ 204 are typically large valued to reduce current through the voltage divider formed by resistors $R_1$ 202 and $R_2$ 204. During operation of the SSTL output buffer, the SSTL output buffer pull down circuit 200 may be designed to have a voltage potential on the input_low signal that is less than $V_{DD}$ and turns on the transistor 216. Accordingly, the SSTL output buffer pull down circuit 200 pulls down the voltage potential of the output signal 215. Inherent capacitances 230 and 233 formed between the output signal 215 and the node $N_1$ 211, and the signal 217 and the node $N_1$ 211, respectively, may cause the voltage potential of the bias signal on node $N_1$ 211 to decrease. Because the resistors $R_1$ 202 and $R_2$ 204 are typically large valued, the resistors $R_1$ 202 and $R_2$ 204 may be slow to restore the desired bias voltage potential of the bias signal on node $N_1$ 211. Accordingly, the resistance formed by transistor 218 increases, and the output signal 215 may not be pulled down at the desired transition rate or obtain the desired voltage potential. Conversely, resistors $R_1$ 202 and $R_2$ 204 may be moderate or small valued to improve the ability to maintain a desired bias voltage potential of the bias signal on node $N_1$ 211. As the combined value of resistors $R_1$ 202 and $R_2$ 204 decrease, the power and current consumed by the resistors $R_1$ 202 and $R_2$ 204 increases.

FIG. 3 shows a typical SSTL output buffer pull up circuit 300 that includes resistors $R_1$ 302 and $R_2$ 304 to provide a bias signal on node $N_1$ 311. A cascode circuit includes transistors 316 and 318. The cascode circuit is used to prevent the possible breakdown of transistors 316 and 318 when an output signal 315 is at a minimum voltage potential.

The output signal 315 is pulled up depending on an input_high signal. The input_high signal may have a voltage potential range less than a maximum voltage potential of the output signal 315, where the voltage potential range is defined as the difference between a maximum and minimum voltage potential applied on the input_high signal.

In FIG. 3, the transistor 318 is connected to the bias signal on node $N_1$ 311. To reduce power consumption, resistors $R_1$ 302 and $R_2$ 304 are typically large valued to reduce current through the voltage divider formed by resistors $R_1$ 302 and $R_2$ 304. During operation of the SSTL output buffer, the SSTL output buffer pull up circuit 300 may be designed to have a voltage potential range on the input_high signal that is less than the $V_{DD}$ to $V_{SS}$ range and turns on the transistor 316. Accordingly, the SSTL output buffer pull up circuit 300 pulls up the voltage potential of the output signal 315. Inherent capacitances 330 and 333 formed between the output signal 315 and the node $N_1$ 311, and the signal 317 and the node $N_1$ 311, respectively, may cause the voltage potential of the bias signal on node $N_1$ 311 to increase. Because the resistors $R_1$ 302 and $R_2$ 304 are typically large valued, the resistors $R_1$ 302 and $R_2$ 304 may be slow to restore the desired bias voltage potential of the bias signal on node $N_1$ 311. Accordingly, the resistance formed by transistor 318 increases, and the output signal 315 may not be pulled up at the desired transition rate or obtain the desired voltage potential. Conversely, resistors $R_1$ 302 and $R_2$ 304 may be moderate or small valued to improve the ability to maintain a desired bias voltage potential of the bias signal on node $N_1$ 311. As the combined value of resistors $R_1$ 302 and $R_2$ 304 decrease, the power and current consumed by the resistors $R_1$ 302 and $R_2$ 304 increases.

SUMMARY OF THE INVENTION

According to one aspect of the present invention, an integrated circuit comprises a biasing circuit arranged to generate a first bias signal; a source follower circuit operatively connected to the first bias signal where the source follower circuit is arranged to generate a second bias signal dependent on the first bias signal; and a cascode circuit operatively connected to the second bias signal where the cascode circuit is arranged to generate an output signal dependent on the second bias signal and an input signal.

According to another aspect, a method for performing a stub series termination logic operation comprises generating a first bias signal dependent on a power supply voltage potential; generating a second bias signal dependent on the first bias signal; and generating an output signal dependent on the second bias signal and an input signal where a maximum voltage potential of the output signal is greater than a voltage potential range of the input signal.

According to another aspect, an integrated circuit comprises means for generating a first bias signal; means for generating a second bias signal dependent on the first bias signal; and means for outputting an output signal dependent on the second bias signal and an input signal to the means for outputting the output signal where a maximum voltage potential of the output signal is greater than a voltage potential range of the input signal.

According to another aspect, an integrated circuit comprises a biasing circuit arranged to generate a first bias signal and a second bias signal; a first source follower circuit operatively connected to the first bias signal where the first source follower circuit is arranged to generate a third bias signal dependent on the first bias signal; a second source follower circuit operatively connected to the second bias signal where the second source follower circuit is arranged to generate a fourth bias signal dependent on the second bias signal; a first cascode circuit operatively connected to the third bias signal where the first cascode circuit is arranged to pull up an output signal dependent on the third bias signal and an input signal; and a second cascode circuit operatively connected to the fourth bias signal where the second cascode circuit is arranged to pull down the output signal dependent on the fourth bias signal and the input signal.

Other aspects and advantages of the invention will be apparent from the following description and the appended claims.

DETAILED DESCRIPTION

In an embodiment of the present invention, a cascode circuit is used to drive an output signal. The cascode circuit requires a bias signal to bias the cascode circuit. A source follower circuit is used to provide the bias signal. The source follower circuit is able to maintain the desired bias voltage potential while requiring only a small amount of current to operate. Furthermore, the source follower circuit does not require a large amount of physical area on an integrated circuit.

A power supply voltage potential for an output buffer may exceed a breakdown voltage potential of transistors used in a design of the output buffer. The transistors may be switched or biased by voltage potentials that are less than the breakdown voltage potential. Accordingly, the transistors may be controlled by a voltage potential range less than the power supply voltage potential.

Figure 1:
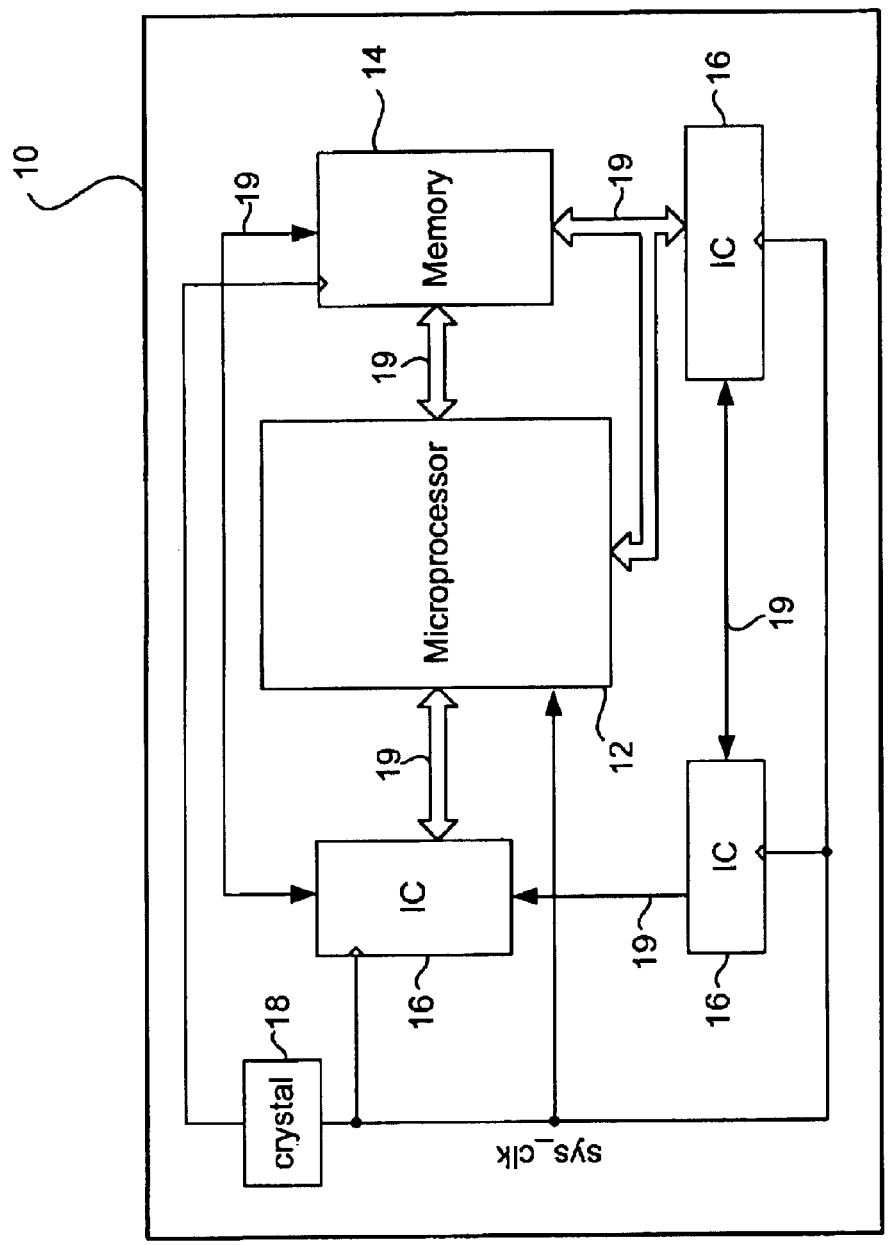
FIG. 1 shows a typical computer system.
Figure 2:
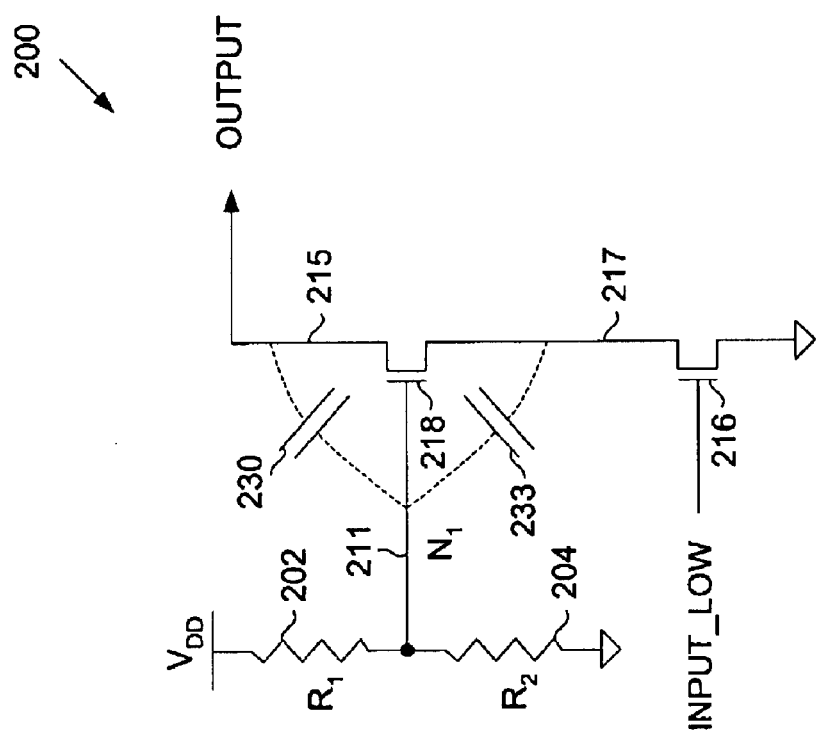
FIG. 2 shows a typical SSTL output buffer pull down circuit.
Figure 3:
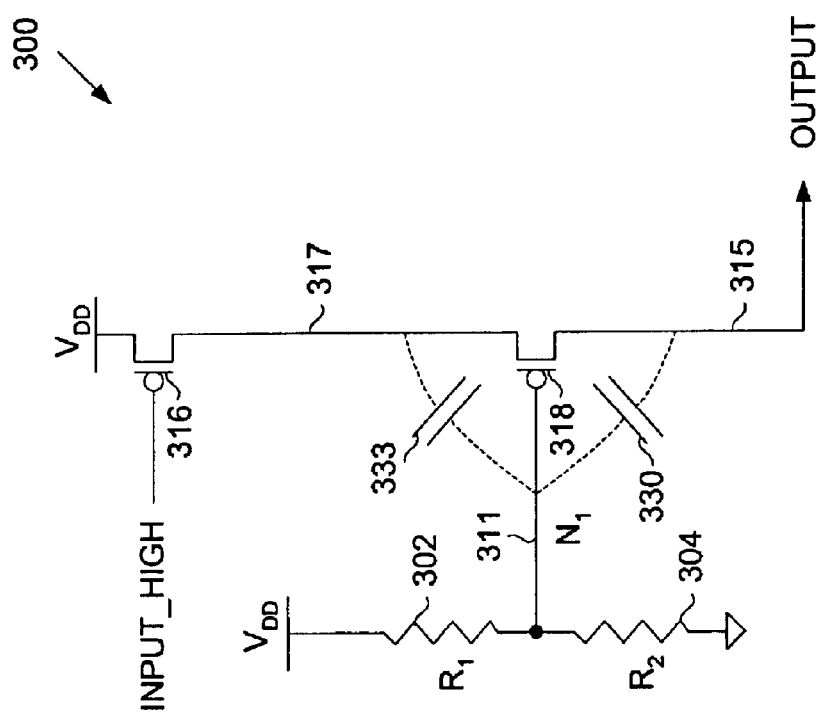
FIG. 3 shows a typical SSTL output buffer pull up circuit.
Figure 4:
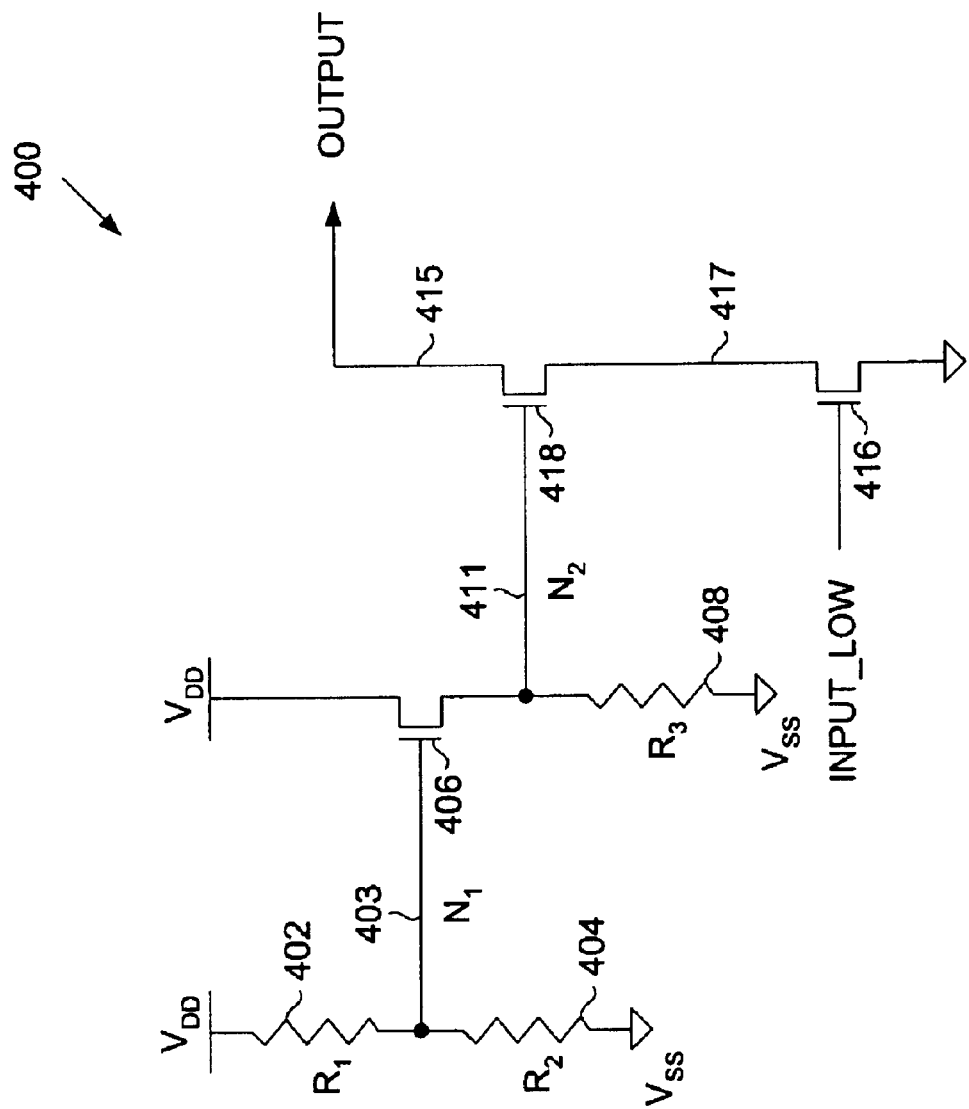
FIG. 4 shows a SSTL output buffer pull down circuit in accordance with an embodiment of the present invention.

FIG. 4 shows an exemplary SSTL output buffer pull down circuit 400 in accordance with an embodiment of the present invention. The SSTL output buffer pull down circuit 400 includes resistors $R_1$ 402 and $R_2$ 404 to provide a first bias signal on node $N_1$ 403. A power supply voltage potential of $V_{DD}$ minus $V_{SS}$ is applied across the resistors $R_1$ 402 and $R_2$ 404 to provide the first bias signal. The first bias signal on node $N_1$ 403 connects to a source follower circuit. The source follower circuit includes transistor 406 and resistor $R_3$ 408. A power supply voltage potential of $V_{DD}$ minus $V_{SS}$ is applied across the source follower circuit. The source follower circuit is arranged to generate a second bias signal on node $N_2$ 411. A voltage potential on node $N_2$ 411 is equal to a voltage potential on node $N_1$ 403 minus a threshold voltage of the transistor 406. For example, if node $N_1$ 403 is 2.0 volts, and a threshold voltage of the transistor 406 is 0.5 volts, then a voltage potential on node $N_2$ 411 is 1.5 volts.

The output signal 415 is pulled down depending on an input_low signal. The input_low signal may have a voltage potential range less than a maximum voltage potential of the output signal 415, where the voltage potential range is defined as the difference between a maximum and minimum voltage potential applied on the input_low signal.

In FIG. 4, the transistor 418 is connected to the second bias signal on node $N_2$ 411 generated by the source follower circuit. To reduce power consumption, resistors $R_1$ 402 and $R_2$ 404 are typically large valued to reduce current through the voltage divider formed by resistors $R_1$ 402 and $R_2$ 404. One of ordinary skill in the art will understand a range of resistor values that are large valued. During operation of the SSTL output buffer, the SSTL output buffer pull down circuit 400 may be designed to have a voltage potential on the input_low signal that is less than $V_{DD}$ and turns on the transistor 416. Accordingly, the SSTL output buffer pull down circuit 400 pulls down the voltage potential of the output signal 415.

Inherent capacitances (not shown) formed between the output signal 415 and the node $N_2$ 411, and the signal 417 and the node $N_2$ 411, may cause the voltage potential of the second bias signal on node $N_2$ 411 to decrease when driving the output signal 415 to low logic level. Because a source follower circuit is disposed between the resistors $R_1$ 402 and $R_2$ 404 and the node $N_2$ 411, the node $N_2$ 411 does not deviate too far from the desired voltage potential because the source follower attempts to maintain a voltage potential on node $N_2$ 411 equal to a voltage potential on node $N_1$ 403 minus a threshold voltage of the transistor 406. As the voltage potential on node $N_2$ 411 decreases, the transistor 406 increases the amount of DC current through the transistor 406 to maintain the desired voltage potential on node $N_2$ 411. Furthermore, the source follower does not consume a large amount of current as the resistor $R_3$ 408 has a relatively large value. The value of the resistor $R_3$ 408 is selected to prevent over-voltage damage caused by node $N_2$ 411 being coupled to a high voltage potential when the output signal 415 is pulled to a high voltage potential by an output buffer pull up circuit (not shown).

Those skilled in the art will understand that, in one or more other embodiments, the first bias signal on node $N_1$ 403 may be generated using a structure other than a voltage divider. For example, a biasing circuit may use active devices, bandgap references, etc. In other words, any biasing circuit that generates one or more bias signals is within the scope of the present invention.

Figure 5:
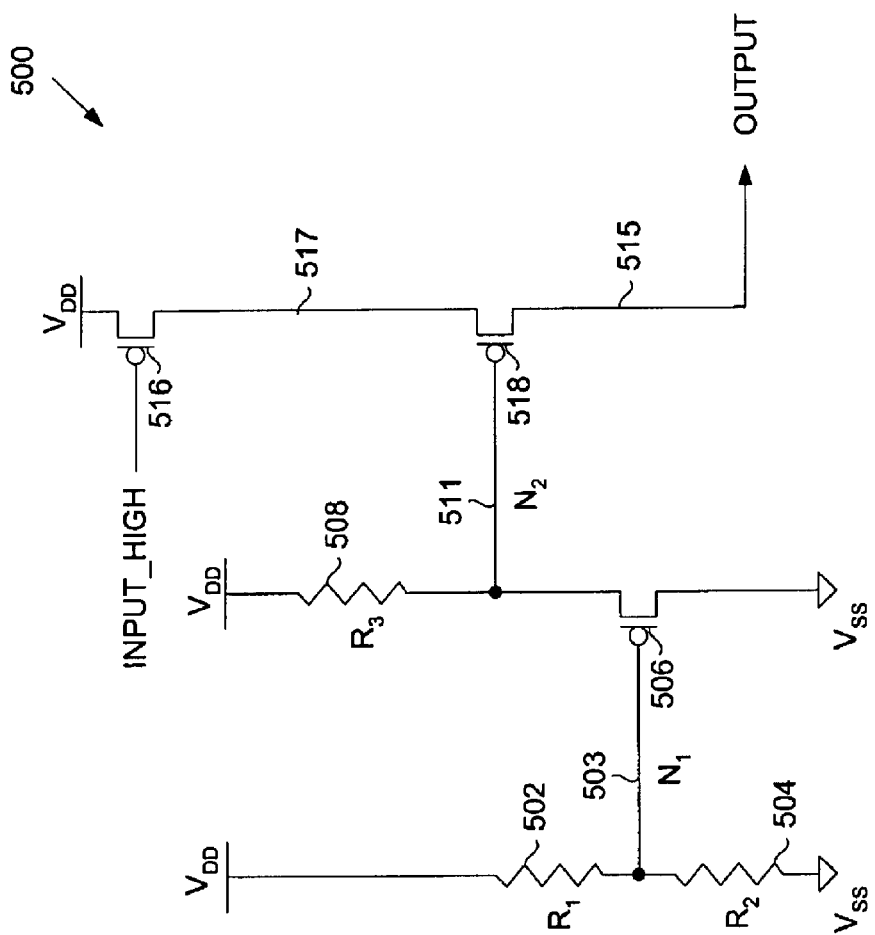
FIG. 5 shows a SSTL output buffer pull up circuit in accordance with an embodiment of the present invention.

FIG. 5 shows an exemplary SSTL output buffer pull up circuit 500 in accordance with an embodiment of the present invention. The SSTL output buffer pull up circuit 500 includes resistors $R_1$ 502 and $R_2$ 504 to provide a first bias signal on node $N_1$ 503. A power supply voltage potential of $V_{DD}$ minus $V_{SS}$ is applied across the resistors $R_1$ 502 and $R_2$ 504 to provide the first bias signal. The first bias signal on node $N_1$ 503 connects to a source follower circuit. The source follower circuit includes transistor 506 and resistor $R_3$ 508. A power supply voltage potential of $V_{DD}$ minus $V_{SS}$ is applied across the source follower circuit. The source follower circuit is arranged to generate a second bias signal on node $N_2$ 511. A voltage potential on node $N_2$ 511 is equal to a voltage potential on node $N_1$ 503 plus a threshold voltage of the transistor 506. For example, if node $N_1$ 503 is 0.5 volts, and a threshold voltage of the transistor 506 is 0.5 volts, then a voltage potential on node $N_2$ 511 is 1.0 volt.

The output signal 515 is pulled up depending on an input_high signal. The input_high signal may have a voltage potential range less than a maximum voltage potential of the output signal 515, where the voltage potential range is defined as the difference between a maximum and minimum voltage potential applied on the input_high signal.

In FIG. 5, the transistor 518 is connected to the second bias signal on node $N_2$ 511 generated by the source follower circuit. To reduce power consumption, resistors $R_1$ 502 and $R_2$ 504 are typically large valued to reduce current through the voltage divider formed by resistors $R_1$ 502 and $R_2$ 504. One of ordinary skill in the art will understand a range of resistor values that are large valued. During operation of the SSTL output buffer, the SSTL output buffer pull up circuit 500 may be designed to have a voltage potential range on the input_low signal that is less than the $V_{DD}$ to $V_{SS}$ range and turns on the transistor 516. Accordingly, the SSTL output buffer pull up circuit 500 pulls up the voltage potential of the output signal 515.

Inherent capacitances (not shown) formed between the output signal 515 and the node $N_2$ 511, and the signal 517 and the node $N_2$ 511, may cause the voltage potential of the second bias signal on node $N_2$ 511 to increase when driving the output signal 515 to high logic level. Because a source follower circuit is disposed between the resistors $R_1$ 502 and $R_2$ 504 and the node $N_2$ 511, the node $N_2$ 511 does not deviate too far from the desired voltage potential because the source follower attempts to maintain a voltage potential on node $N_2$ 511 equal to a voltage potential on node $N_1$ 503 plus a threshold voltage of the transistor 506. As the voltage potential on node $N_2$ 511 increases, the transistor 506 increases the amount of DC current through the transistor 506 to maintain the desired voltage potential on node $N_2$ 511. Furthermore, the source follower does not consume a large amount of current as the resistor $R_3$ 508 has a relatively large value. The value of the resistor $R_3$ 508 is selected to prevent over-voltage damage caused by node $N_2$ 511 being coupled to a low voltage potential when the output signal 515 is pulled to a low voltage potential by an output buffer pull down circuit (not shown).

Those skilled in the art will understand that, in one or more other embodiments, the first bias signal on node $N_1$ 503 may be generated using a structure other than a voltage divider. For example, a biasing circuit may use active devices, bandgap references, etc. In other words, any biasing circuit that generates one or more bias signals is within the scope of the present invention.

One of ordinary skill in the art will understand that resistors 402, 404, and 408 shown in FIG. 4, and resistors 502, 504, and 508 shown in FIG. 5 are representative of a resistive element. The resistive element provides a voltage drop across the terminals of the resistive element when current flows through the resistive element. Accordingly, the resistive element may be, but not limited to, a resistor, a transistor, or a diode connected transistor. A transistor may be in a linear or saturation region of operation. A diode connected transistor is a transistor in which a gate terminal is connected to either a source terminal or drain terminal of the transistor. Accordingly, the diode connected transistor behaves like a diode.

In one or more embodiments of the present invention a SSTL output buffer pull down circuit, for example SSTL output buffer pull down circuit 400, and a SSTL output buffer pull up circuit, for example SSTL output buffer pull up circuit 500, may be combined. One of ordinary skill in the art will understand that both a pull up circuit and a pull down circuit may be used in combination.

Advantages of the present invention may include one or more of the following. In one or more embodiments, a SSTL output buffer includes a cascode circuit to drive an output signal. Because the SSTL output buffer uses a source follower circuit to generate a bias signal to the cascode circuit, the bias signal does not deviate substantially from a desired voltage potential on the bias signal.

In one or more embodiments, a source follower circuit used in a SSTL output buffer does not consume a large amount of current. A resistor in the source follower circuit need only provide a leakage path such that a transistor in the source follower circuit may respond to various changes in voltage potential on a bias signal output of the source follower circuit. Accordingly, the resistor may have a relatively large value.

In one or more embodiments, a source follower circuit used in a SSTL output buffer generates a bias signal does not deviate substantially from a desired voltage potential. A stable bias signal enables a stable impedance observed from a SSTL output buffer.

In one or more embodiments, a source follower circuit does not require a large amount of physical area on an integrated circuit. Accordingly, including a source follower circuit as part of a SSTL output buffer does not require substantially more area on chip.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
a biasing circuit arranged to generate a first bias signal;
a source follower circuit operatively connected to the first bias signal, wherein the source follower circuit is arranged to generate a second bias signal dependent on the first bias signal; and
a cascode circuit operatively connected to the second bias signal, wherein the cascode circuit is arranged to generate an output signal dependent on the second bias signal and an input signal.

2. The integrated circuit of claim 1, wherein the biasing circuit, the source follower circuit, and the cascode circuit are part of a stub series termination logic output buffer circuit.

3. The integrated circuit of claim 1, wherein the cascode circuit comprises a transistor having a breakdown voltage potential less than a maximum voltage potential of the output signal.

4. The integrated circuit of claim 1, wherein the cascode circuit comprises a transistor having a breakdown voltage potential less than a power supply voltage potential across the source follower circuit.

5. The integrated circuit of claim 1, wherein the cascode circuit comprises a plurality of transistors, wherein at least one of the plurality of transistors is biased by the second bias signal, and wherein at least one of the plurality of transistors is operatively connected to the input signal.

6. The integrated circuit of claim 5, wherein a maximum voltage potential of the output signal is greater than a voltage potential range of the input signal.

7. The integrated circuit of claim 1, wherein the source follower circuit comprises a transistor having a breakdown voltage potential less than a maximum voltage potential of the output signal.

8. The integrated circuit of claim 1, wherein the source follower circuit comprises a transistor having a breakdown voltage potential less than a power supply voltage potential across the source follower circuit.

9. The integrated circuit of claim 1, wherein the biasing circuit comprises a plurality of resistive elements operatively connected in series.

10. The integrated circuit of claim 9, wherein at least one of the plurality of resistive elements is one selected from the group consisting of a resistor, a transistor, and a diode connected transistor.

11. The integrated circuit of claim 1, wherein the source follower circuit comprises a resistive element.

12. The integrated circuit of claim 11, wherein the resistive element is at least one selected from the group consisting of a resistor, a transistor, and a diode connected transistor.

13. A method for performing a stub series termination logic operation, comprising:
    generating a first bias signal dependent on a power supply voltage potential;
    generating with a circuit a second bias signal dependent on the first bias signal such that a voltage of the second bias signal is substantially equal to voltage of the first bias signal minus a threshold voltage of the circuit; and
    generating with cascode circuit an output signal dependent on the second bias signal and an input signal.

14. The method of claim 13, wherein the generating the output signal uses a plurality of transistors, wherein at least one of the plurality of transistors is biased by the second bias signal, and wherein at least one of the plurality of transistors is operatively connected to the input signal.

15. The method of claim 13, wherein the generating the output signal uses a transistor having a breakdown voltage potential less than a maximum voltage potential of the output signal.

16. The method of claim 13, wherein the generating the output signal uses a transistor having a breakdown voltage potential less than the power supply voltage potential.

17. The method of claim 13, wherein the generating the second bias signal uses a transistor having a breakdown voltage potential less than a maximum voltage potential of the output signal.

18. The method of claim 13, wherein the generating the second bias signal uses a transistor having a breakdown voltage potential less than the power supply voltage potential.

19. The method of claim 13, wherein the generating the first bias signal uses a plurality of resistive elements connected in series.

20. The method of claim 19, wherein at least one of the plurality of resistive elements is one selected from the group consisting of a resistor, a transistor, and a diode connected transistor.

21. An integrated circuit, comprising:
    means for generating a first bias signal;
    means for generating a second bias signal dependent on the first bias signal; and
    means for outputting an output signal dependent on the second bias signal and an input signal to the means for outputting the output signal, wherein a maximum voltage potential of the output signal is greater than a voltage potential range of the input signal.

22. The integrated circuit of claim 21, wherein the means for outputting the output signal comprises a transistor having a breakdown voltage potential less than a maximum voltage potential of the output signal.

23. The integrated circuit of claim 21, wherein the means for outputting the output signal comprises a transistor having a breakdown voltage potential less than a power supply voltage potential of the means for generating the second bias signal.

24. The integrated circuit of claim 21, wherein the means for generating the second bias signal comprises means for maintaining a voltage on the second bias signal, wherein the breakdown voltage of the means for maintaining is less than a maximum voltage potential of the output signal.

25. The integrated circuit of claim 21, wherein the means for generating the second bias signal comprises means for maintaining a voltage on the second bias signal, wherein the breakdown voltage of the means for maintaining is less than a power supply voltage potential of the means for generating the second bias signal.

26. An integrated circuit, comprising:
    a biasing circuit arranged to generate a first bias signal and a second bias signal;
    a first source follower circuit operatively connected to the first bias signal, wherein the first source follower circuit is arranged to generate a third bias signal dependent on the first bias signal;
    a second source follower circuit operatively connected to the second bias signal, wherein the second source follower circuit is arranged to generate a fourth bias signal dependent on the second bias signal;
    a first cascode circuit operatively connected to the third bias signal, wherein the first cascode circuit is arranged to pull up an output signal dependent on the third bias signal and an input signal; and
    a second cascode circuit operatively connected to the fourth bias signal, wherein the second cascode circuit is arranged to pull down the output signal dependent on the fourth bias signal and the input signal.

27. An integrated circuit, comprising:
    a biasing circuit arranged to generate a first bias signal;
    a source follower circuit operatively connected to the first bias signal, wherein the source follower circuit is arranged to generate a second bias signal dependent on the first bias signal; and a cascade circuit operatively connected to the second bias signal, wherein the cascade circuit is arranged to generate an output signal dependent on the second bias signal and an input signal, wherein at least one of the cascode circuit and the source follower circuit comprises a transistor having a breakdown voltage potential less than at least one of a maximum voltage potential of the output signal and a power supply voltage potential across the source follower circuit.

28. A method for performing a stub series termination logic operation, comprising:

generating a first bias signal dependent on a power supply voltage potential;

generating a second bias signal dependent on the first bias signal; and generating an output signal dependent on the second bias signal and an input signal, wherein a maximum voltage potential of the output signal is greater than a voltage potential range of the input signal, wherein at least one of the generating the output signal and the generating the second bias signal uses a transistor having a breakdown voltage less than at least one of a maximum voltage of the output signal and the power supply voltage potential.

* * * * *